United States Patent [19]

Yates et al.

[11] Patent Number: 4,986,921

[45] Date of Patent: Jan. 22, 1991

[54] CELLULOSE ACETATE BOUND PHOTOSENSITIZER FOR PRODUCING SINGLET OXYGEN

[75] Inventors: Stephen F. Yates, Arlington Heights, Ill.; Mary L. Good, Convent Station, N.J.; Inara M. Brubaker, Des Plaines, Ill.

[73] Assignee: Allied-Signal Inc., Morris Township, Morris County, N.J.

[21] Appl. No.: 574,624

[22] Filed: Aug. 29, 1990

Related U.S. Application Data

[62] Division of Ser. No. 287,318, Dec. 20, 1988.

[51] Int. Cl.$^5$ .................... C02F 1/70; G03G 15/00; G03G 5/00; G03G 15/06
[52] U.S. Cl. ........................ 210/758; 430/56; 430/73; 430/83; 430/154; 430/170; 252/188.1
[58] Field of Search ............... 210/758; 252/188.1; 430/56, 73, 83, 154, 170

[56] References Cited

U.S. PATENT DOCUMENTS 4,315,998  2/1982  Neckers et al. ............. 525/359.3

FOREIGN PATENT DOCUMENTS 1054971  7/1978  Canada.
1044639  12/1978  Canada.

*Primary Examiner*—Nathan M. Nutter
*Attorney, Agent, or Firm*—Frank S. Molinaro; Harold N. Wells; Gerard P. Rooney

[57] ABSTRACT

This invention relates to a photosensitizer which is bound to a cellulose acetate polymer, a method of preparing the bound photosensitizer and a process for using the bound photosensitizer. The photosensitizers which may be used in the invention include rose bengal, rhodamine B, acridine orange, methylene blue and zinc phthalocyanine. The photosensitizer is attached to the cellulose acetate by reacting an acid group on the photosensitizer with a hydroxyl group. Finally, the bound photosensitizer may be used to oxidize undesirable oxidizable compounds present in a hydrocarbon or aqueous fraction. One specific example is the sweetening of kerosene which involves oxidizing the mercaptans contained in the kerosene.

9 Claims, No Drawings

CELLULOSE ACETATE BOUND PHOTOSENSITIZER FOR PRODUCING SINGLET OXYGEN

This application is a division of application Ser. No. 07/287,318, filed Dec. 20, 1988 pending.

BACKGROUND OF THE INVENTION

Diatomic oxygen in its ground state is a paramagnetic molecule because it has a triplet ground state. Electronic excitation can produce either of two excited states, both of which are diamagnetic singlet states. The lower excited state, $^1\Delta_g$, has an energy of 22.5 kcal/mol above the ground state while the higher excited state, $^1\Sigma_g$, has an energy of 37.5 kcal/mol. Only the lower excited state has a long enough lifetime to be chemically active in solution and is normally referred to as "singlet oxygen", $^1O_2$.

Singlet oxygen has been found to be a much stronger oxidizing agent than ground state molecular oxygen. Singlet oxygen has a calculated reduction potential of 1.7 V which makes it a better oxidizing agent (in non-acidic conditions) than ozone, hydrogen peroxide, sodium hypochlorite and chlorine dioxide. Thus, singlet oxygen can be used in a number of oxidation reactions such as synthesis of organic compounds, removal of humic acid from water, removal of phenols from waste streams, removal of cyanide from electroplating waste, oxidation of mercaptans in hydrocarbon streams and destruction of bacteria in various streams.

The usual method of generating singlet oxygen is by energy transfer from light and a photosensitizer. The role of the photosensitizer is to absorb the light and transfer its energy to the oxygen thereby forming singlet oxygen. The mechanism for producing singlet oxygen is well known in the art and the photosensitizers which can be used to produce singlet oxygen are also well known. Illustrative of these photosensitizers are rose bengal, methylene blue, eosin, chlorophyll, fluorescein, pyrene, acridine orange, porphyrins, phthalocyanines, etc.

The prior art teaches that these photosensitizers are usually used in a homogeneous phase; that is, the photosensitizer is dissolved in the reaction medium. This has the disadvantage that the photosensitizer must be separated from the reaction product. Even if separation is possible, complete separation is usually not achieved which means that fresh photosensitizer must be added to the fresh reaction medium. Since photosensitizers are expensive, the loss of photosensitizer may make the overall process uneconomical. Moreover, the effective concentration of photosensitizer which can be employed is limited not only owing to the increased difficulty of separating the photosensitizer from the products, but also owing to the fact that at higher concentrations the photosensitizers tend to form dimers and higher aggregates which reduce their effectiveness as photosensitizers.

One way to solve these problems is to carry out the photooxidation in a heterogeneous phase. Such a system is disclosed in U.S. Pat. No. 4,315,998 (see also Canadian patent Nos. 1,044,639 and 1,054,971). The '998 patent discloses chemically binding the photosensitizer to a polymeric material. The polymer used in the '998 patent is a modified crosslinked polystyrene polymer to which the photosensitizer is bound. The process used to attach the photosensitizer to the crosslinked polystyrene is a nucleophilic displacement reaction. However, crosslinked polystyrene has several disadvantages. One disadvantage is that crosslinked polystyrene is not transparent and thus only a portion of the photosensitizer is exposed to light. For example, if the polystyrene is in the shape of spheres which are placed in a column, only the outside spheres will be exposed to light, while the interior spheres will not. Therefore, reaction will only take place on the exterior of the column. Also, polystyrene has a tendency to swell and deteriorate in organic solvents.

Thus, there is a need for a polymer bound photosensitizer which utilizes all the available photosensitizers and is stable in organic solvents. Applicants have developed such a photosensitizer. Applicants' polymer bound photosensitizer consists of a cellulose acetate polymer to which is bound a photosensitizer. The photosensitizer is bound to the cellulose acetate by reacting a functional group (e.g., carboxylic acid group, sulfonyl chloride group, etc.) on the photosensitizer with a hydroxyl group on the cellulose acetate, thereby forming an ester linkage. Hydroxyl groups are present on the cellulose acetate because the cellulose acetate is not fully acetylated.

Comparing the cellulose acetate bound photosensitizer of the present invention with the polystyrene bound photosensitizer of the prior art shows several striking differences. First, the cellulose acetate polymer of the present invention is clear and lets light through whereas the crosslinked polystyrene of the '998 patent is opaque and does not let light through. Second, cellulose acetate neither swells nor deteriorates in organic solvents whereas the crosslinked polystyrene does swell in organic solvents. Third, cellulose acetate can be applied as a coating onto various solid supports whereas the crosslinked polystyrene cannot. Finally, the methods of attaching the photosensitizer to the polymer are different. The photosensitizer in the present case is attached to the polymer through an esterification reaction, whereas the '998 patent uses a nucleophilic displacement reaction to attach the photosensitizer. For all of these reasons, applicants' invention represents a significant improvement in the art.

Not only have the applicants bound photosensitizers to a polymer which has several advantages over polymer bound photosensitizers of the prior art, applicants are the first to discover a new use for the cellulose acetate bound photosensitizer. This new use involves oxidizing mercaptans which are present in various hydrocarbon streams with singlet oxygen generated from light, oxygen and a cellulose acetate bound photosensitizer. The conventional or prior art way of treating a hydrocarbon stream containing mercaptans is to first contact the hydrocarbon fraction with an aqueous alkaline solution, thereby transferring the mercaptans into the aqueous phase, followed by oxidation of the mercaptans with oxygen in the presence of a metal phthalocyanine catalyst. This process has the disadvantage in that it forms a waste alkaline stream which must be disposed. By using photooxidation, the disposal problems associated with the use of an alkaline solution are eliminated. Therefore, applicants' invention solves an important environmental problem related to the disposal of the alkaline solution.

SUMMARY OF THE INVENTION

This invention relates to a cellulose acetate bound photosensitizer, a method of preparing the cellulose acetate bound photosensitizer and a method of using the cellulose acetate bound photosensitizer.

Accordingly, one embodiment of the invention is a cellulose acetate bound photosensitizer comprising an ester which is the reaction product of a hydroxyl group on the cellulose acetate and an ester forming acidic group of the photosensitizer. One specific embodiment of the invention is rose bengal bound to cellulose acetate.

Another embodiment of the invention is a method of preparing a cellulose acetate bound photosensitizer comprising reacting a hydroxyl group on the cellulose acetate with an esterifiable acidic group on the photosensitizer at reaction conditions in the presence of an esterification reagent to form an ester linkage.

A further specific embodiment of the invention is a method of binding rose bengal to cellulose acetate comprising reacting rose bengal with cellulose acetate in the presence of N,N'-carbonyldiimidazole, at a temperature of about 50° C. for a time of about 6 hours. An acid catalyst such as methanesulfonic acid may be added to accelerate the reaction.

Still another embodiment of the invention is a method of preparing a cellulose acetate bound photosensitizer comprising reacting a hydroxyl group attached to cellulose acetate with a sulfonyl halide group attached to a photosensitizer at reaction conditions, in the presence of a base to form an ester linkage.

Yet another specific embodiment is a method of binding zinc phthalocyanine to cellulose acetate comprising reacting a sulfonyl chloride derivative of zinc phthalocyanine with cellulose acetate in the presence of pyridine at a temperature of about 60° C. for a time of about 4 hours to form an ester linkage.

Yet another embodiment of the invention is a method of oxidizing undesirable oxidizable compounds present in a hydrocarbon or aqueous fraction comprising contacting the hydrocarbon or aqueous fraction with a cellulose acetate bound photosensitizer in the presence of molecular oxygen and light, thereby oxidizing the oxidizable compound by reacting the oxidizable compound with singlet oxygen which is generated from molecular oxygen by energy transfer from the light and the cellulose acetate bound photosensitizer, and producing a treated hydrocarbon or aqueous fraction.

Yet another specific embodiment is a method of oxidizing mercaptans present in a hydrocarbon fraction comprising contacting the hydrocarbon fraction with rose bengal bound to cellulose acetate in the presence of molecular oxygen and light, thereby oxidizing the mercaptans and producing a sweet hydrocarbon fraction.

Other objects and embodiments will become more apparent after a more detailed description of the invention.

DETAILED DESCRIPTION OF THE INVENTION

As indicated, the present invention relates to a photosensitizer bound to cellulose acetate, a method of binding the photosensitizer to the cellulose acetate and a method of oxidizing oxidizable compounds using the photosensitizer bound to a cellulose acetate polymer.

Accordingly, the two essential features of the present invention are cellulose acetate and a photosensitizer. The cellulose acetate which is used in the invention must contain free hydroxyl groups in order to bind the photosensitizer. Commercially available cellulose acetate will vary considerably in the degree of acetylation, i.e., number of acetates per monomer, with the triacetates being fully acetylated. For use in the present invention cellulose acetate containing from about 1.6 to about 2.8 acetates per monomer (about 1.4 to about 0.2 hydroxyls per monomer) may be chosen.

A photosensitizer is the other essential component of the invention. A photosensitizer is a compound which promotes a chemical reaction by absorbing light and transferring its energy to another compound which carries out the reaction. The criterion used to choose a photosensitizer is that the excited state of the photosensitizer be at a higher energy than the singlet oxygen energy state. For a more complete explanation of energy-transfer mechanisms, see N. J. Turro, *MODERN MOLECULAR PHOTOCHEMISTRY*, Benjamin/Cummings Publishing Co. Inc., p. 309–311 (1978). Photosensitizers which can be used in the present invention fit into several classes: (1) xanthene dyes, illustrative examples of which are rose bengal, rhodamine B, erythrosin, eosin and fluorescein; (2) thiazine dyes, an example of which is methylene blue; (3) porphyrins and porphines, examples of which are zinc tetraphenylporphyrin, zinc phthalocyanine, magnesium phthalocyanine, calcium phthalocyanine, scandium phthalocyanine, and aluminum phthalocyanine; (4) acridines, an example of which is acridine orange and (5) other aromatics, examples of which are pyrene, dinaphthalene thiophene and heterocoerdianthrone. Preferred photosensitizers are rose bengal, rhodamine B and the metal phthalocyanines.

The photosensitizer is bound to the cellulose acetate through an ester linkage which is the result of the reaction between an acid group on the photosensitizer and a hydroxyl group on the cellulose acetate. The acid group may occur naturally on the photosensitizer or the photosensitizer may be modified to bond an acid group to the photosensitizer. Thus, when reference is made to a photosensitizer that does not naturally contain an acid group, it is to be understood that the photosensitizer has been modified to contain such a group. In carrying out the reaction, the cellulose acetate can be either in solution or may be in a rigid form such as fibers or films. The method of preparation when the cellulose acetate is in solution will be described first.

Accordingly, the first step is to mix a solution of cellulose acetate and the photosensitizer. It is important that the solvent which is used to prepare these solutions not react with either the cellulose acetate or the photosensitizer. Illustrative of the solvents which meet this criterion are ketones, polar ethers, nitriles and amides. Specific examples of these solvents are acetone, dioxane, tetrahydrofuran (THF), dimethoxyethane, acetonitrile, N,N-dimethylformamide (DMF) and N-methylpyrrolidone.

In order to carry out the esterification reaction, it is necessary that the photosensitizer contain a functional group in its molecular structure which is capable of reacting with a hydroxyl group on the cellulose acetate. Usually the functional group is an acidic group and will be referred to herein as an esterifiable acidic group. Esterifiable acidic groups which are particularly suited for this reaction are carboxylic acid groups, functional derivatives of carboxylic acids such as acid halides and acid anhydrides, sulfonic acid groups and sulfonyl halides. The esterifiable acidic group may occur naturally in the photosensitizer structure, e.g., rose bengal contains a carboxylic acid group, or may be attached to the photosensitizer by a separate reaction well known in the art. For example, zinc phthalocyanine can be converted to zinc phthalocyaninesulfonyl chloride by reacting zinc phthalocyanine with chlorosulfonic acid and thionyl chloride (see the general procedure in U.S. Pat. No. 3,305,559). Depending on the reaction condition, more than one sulfonyl chloride group may be attached to the phthalocyanine. In turn the zinc phthalocyaninesulfonyl chloride can react with a hydroxyl group on the cellulose acetate to give a sulfonate ester. Another example involves alkylating acridine orange by reacting it with chloromethylbenzoic acid to form a carboxylate salt of acridine orange which can be reacted with a hydroxyl group to form an ester. Thus, when reference is made to a photosensitizer, it is to be understood that the photosensitizer has attached to it an esterifiable acidic group. For example, when phthalocyanine is mentioned it is to be understood that the phthalocyanine has been modified to contain an esterifiable acidic group.

When the photosensitizer contains a carboxylic acid group, it is desirable to add an esterification reagent to the mixture of cellulose acetate and photosensitizer. The function of the esterification reagent is to promote esterification by forming a highly reactive intermediate. A preferred esterification reagent is N,N'-carbonyldiimidazole which reacts with a carboxylic acid, e.g., on rose bengal, to form the highly reactive imidazolide of the carboxylic acid. Examples of other esterification reagents which can be used are trimethylsilylimidazole, N,N-dicyclohexylcarbodiimide and trifluoroacetic anhydride.

It is also desirable to add an acid catalyst to accelerate the esterification reaction. Illustrative of acid catalysts which can be used are methanesulfonic acid, benzenesulfonic acid and toluenesulfonic acid. The amount of acid catalyst to be added can vary substantially, but is conveniently chosen to be from about 0.25 to about 0.75 moles/mole of photosensitizer. It is further necessary that the solution mixture which contains all the desired components be heated to a temperature and for a time sufficient to react the hydroxyl group and the carboxylic acid, thereby ensuring complete formation of the ester linkage. The temperature and time required to carry out the esterification reaction depends on the esterification reagent chosen. Generally the conditions can be a temperature from about 30° C. to about 300° C. and a time from about 5 minutes to about 2 days. Specifically when the esterification reagent is N,N'-carbonyldiimidazole it is desirable to heat the solution mixture at a temperature of about 40° to about 100° C. for a time of about 1 to about 6 hours. When N,N-dicyclohexylcarbodiimide is used the preferred conditions are a temperature from about 30° to about 150° C. and a time from about 1 to about 10 hours.

When the esterifiable acidic group is an acid halide, e.g., sulfonyl halide or carboxylic acid halide, an esterification reagent is not necessary because of the high reactivity of the acid halide. However, it is necessary to add a base to the reaction medium in order to neutralize the acid, e.g., hydrochloric acid, which is generated during the reaction. Illustrative of the bases which can be used are pyridine, triethylamine, lutidine and p-dimethylaminopyridine. The amount of base to be added can vary substantially, but must be at least equal to the moles of the acid halide group. Therefore, the amount of base is conveniently chosen to be from about 1.0 to about 5.0 moles/mole of acid halide. It is further necessary that the solution mixture which contains all the desired components be heated to a temperature of about 30° to about 100° C. for a time of about 1 to about 6 hours, thereby ensuring complete formation of the ester linkage.

In order to fully utilize the cellulose acetate bound photosensitizer, it is desirable to form the cellulose acetate bound photosensitizer into a variety of shapes or forms. For example, glass beads may be coated with the solution of cellulose acetate bound photosensitizer and dried to give beads coated with a photosensitizer bound to a cellulose acetate. The solution of cellulose acetate bound photosensitizer may also be used to coat various glass, ceramic or metallic articles in the shape of rings, helices, spheres, small tubes, plates, etc.

As stated, it is not necessary to dissolve the cellulose acetate in order to carry out the esterification reaction. One can use cellulose acetate in whatever form is desirable, e.g., a film or hollow fiber, to carry out the esterification reaction. In this case a solvent is chosen in which the photosensitizer is soluble but in which the cellulose acetate is not soluble. The reaction conditions and other details of the process are as described above.

The cellulose acetate bound photosensitizer can be used to oxidize undesirable oxidizable compounds present in a hydrocarbon or aqueous fraction. Examples of the types of hydrocarbon or aqueous fractions which can be treated and the undesirable compound contained therein which will be oxidized are: removal of humic acid from ground and surface waters, removal of phenols from organic and aqueous waste streams, cyanide removal from electroplating waste, destruction of bacteria in aqueous streams, and oxidation of mercaptans in hydrocarbon fractions. The treatment process involves contacting the hydrocarbon or aqueous fraction with the cellulose acetate bound photosensitizer in the presence of oxygen and light. The oxygen may be added in any convenient way such as by sparging air into the system. The wavelength of the light used is also important and should be chosen so that the range of the wavelength of the light includes the wavelength of maximum absorbance for the photosensitizer. In general the wavelength of the light should be in the range of about 350 to about 800 nm. For example, when rose bengal is the photosensitizer a sodium arc lamp is preferred because it emits a considerable amount of radiant power at wavelengths between about 560 to about 620 nanometers. This range of wavelength encompasses the absorbance maximum of rose bengal which occurs at 568 nanometers.

The photooxidation process described above can be carried out either in a batch mode or a continuous flow mode. When a batch mode is desired, it is desirable that the fraction to be treated be contacted with the oxygen and cellulose acetate bound photosensitizer, e.g., coated on beads, for a time of about 30 to about 450 minutes. Since the singlet oxygen which is generated by the interaction of the photosensitizer and oxygen is short lived (4–4,000 $\mu$sec.), it is also desirable to use a mixing method to ensure complete contact between the singlet oxygen generated at the polymer surface and the compound to be oxidized. For example, an annular reactor may be used and the hydrocarbon recirculated for a time sufficient to obtain the desired conversion.

In order to more fully illustrate the advantages to be derived from the instant invention, the following examples are set forth. It is to be understood that the examples are only by way of illustration and are not intended as an undue limitation on the broad scope of the invention as set forth in the appended claims.

EXAMPLE I

Rose bengal was attached to cellulose acetate by the following procedure.

A 250 mL three neck round bottom flask equipped with a stirbar, condenser, nitrogen line and thermometer was flushed with nitrogen. To this were added 150 mL acetone (dried over magnesium sulfate) and 6.8 g cellulose acetate (Eastman Kodak). The mixture was heated to reflux until all the cellulose acetate dissolved, yielding a colorless solution. This solution was cooled to room temperature and 2.0 g (2.0 mmol) rose bengal was added. Stirring gave an intensely red solution. Next, 0.49 g N,N'-carbonyldiimidazole was added followed by 1-2 drops (about 0.1 mL) of methanesulfonic acid. This solution was heated to about 50° C. While there were no signs of reaction initially, gas evolution was observed as the temperature rose. This stopped after five minutes. The reaction mixture was held about 50° C. for 6 hrs and then cooled to room temperature.

The above solution was used to coat 3 mm glass beads by dipping the beads into the solution. The beads were filtered from the solution by using a meshed screen and then heated in an oven at 120° C. for 5 minutes with occasional shaking.

EXAMPLE II

Rhodamine B was attached to cellulose acetate in the same manner as rose bengal was attached to cellulose acetate. A 250 mL three neck round bottom flask equipped with a stirbar, condenser, nitrogen line and thermometer was flushed with nitrogen. To this there were added 150 mL acetone (dried over magnesium sulfate) and 6.8 g cellulose acetate (Eastman Kodak). The mixture was heated to reflux until all the cellulose acetate dissolved, yielding a colorless solution. This solution was cooled to room temperature and 0.97 g of rhodamine B was added. Stirring gave a dark red solution. Next, 0.49 g N,N'-carbonyldiimidazole was added, followed by 1-2 drops (about 0.1 mL) of methanesulfonic acid. This solution was heated to about 50° C. While there were no signs of reaction initially, gas evolution was observed as the temperature rose. This stopped after five minutes. The reaction mixture was held at about 50° C. for 6 hours.

EXAMPLE III

Acridine orange was attached to cellulose acetate as follows. Since acridine orange does not contain a carboxylic acid group, it was first modified as follows. A 250 mL three neck round bottom flask equipped with a condenser, nitrogen line and stirbar was flushed with nitrogen. To this were added 2 g (7.5 mmol) of acridine orange, and 100 mL ethanol. Stirring gave a dark orange solution. Next, 1.3 g (7.6 mmol) of chloromethylbenzoic acid was added, and the reaction mixture was heated to 60° C. for 24 hours. Filtration of reaction product yielded 2.23 g (74.4% yield) of a red brown solid. Formation of a carboxylate salt was confirmed by IR and proton NMR.

The modified acridine orange was bound to cellulose acetate by the same method as used in Example I.

EXAMPLE IV

Zinc phthalocyanine was attached to cellulose acetate by the following procedure. First, zinc phthalocyaninesulfonyl chloride was prepared.

A 50 mL three neck round bottom flask was equipped with a condenser and stirbar. A "T" style nitrogen inlet adapter was used to blow nitrogen across the outlet of the condenser and then to a bubbler filled with water. To this flask were added 2.0 g (3.5 mmol) of zinc phthalocyanine and, cautiously, 4.8 mL (72.1 mmol) of chlorosulfonic acid. The acid reacted with the solid dye to provide a dark green-black paste, and white fumes were emitted which passed the condenser and were absorbed by the water trap. This mixture was heated to 120° C. for 24 hours.

After cooling to room temperature, 4 mL (54.8 mmol) of thionyl chloride were added, dissolving the sludge to give a black solution. This solution was heated with stirring at 60° C. for an additional 24 hours. Then, the solution was cooled by immersing the flask in an ice/water slurry, and water was added cautiously. The reaction with water was initially very exothermic, with evolution of white fumes. Once no further reaction was observed when water was added, the reaction mixture was filtered with suction to give a dark purple solid (2.21 g, 65.4% yield). The dark purple solid was identified as zinc phthalocyaninesulfonyl chloride with a degree of sulfonation, i.e., number of sulfonyl chloride groups, of 1-2.

Next, a 250 mL round bottom flask was equipped with a condenser and stirrer, and charged with 122 mL of acetone and 0.60 g (7.6 mmol) of pyridine. To this were added 5.53 g of cellulose acetate in portions with stirring. A homogeneous solution was obtained. Now 1.40 g (1.4 mmol) of zinc phthalocyaninesulfonyl chloride were added with stirring to obtain a dark blue mixture. This was heated to 60° C. for 4 hours, then cooled to room temperature.

The above solution was used to coat 3 mm glass beads as described in Example I.

EXAMPLE V

An apparatus was designed to test the ability of the zinc phthalocyanine coated glass beads of Example IV to sweeten a sour kerosene fraction. Into a 1 L three neck round bottom flask there were placed 500 mL of kerosene containing 294 ppm mercaptans. Air was added to the kerosene through an air sparger inserted through the middle opening of the flask. Two pumps were attached to the flask in order to pump the kerosene into and out of an annular reactor at a flow rate of 10 mL/min. The annular reactor was filled with 454 g of 3 mm zinc phthalocyanine coated glass beads prepared in Example IV. A sodium arc lamp (GE Lucalox TM lamp) was placed in the center of the reactor and provided the light source. Samples were periodically collected and analyzed for mercaptan content. These results are presented in Table 1.

TABLE 1

| Photooxidation of Mercaptans Using Zinc Phthalocyanine as the Photosensitizer | |
|---|---|
| Time (min) | Mercaptan Conc. (ppm) |
| 0 | 296 |
| 110 | 145 |
| 185 | 78 |
| 260 | 56 |

TABLE 1-continued

| Photooxidation of Mercaptans Using Zinc Phthalocyanine as the Photosensitizer | |
|---|---|
| Time (min) | Mercaptan Conc. (ppm) |
| 320 | 63 |

The data presented in Table 1 clearly show that zinc phthalocyanine bound to cellulose acetate is very effective at sweetening (removing mercaptans) kerosene.

We claim as our invention:

1. A method of oxidizing undesirable oxidizable compounds present in a hydrocarbon or aqueous fraction comprising contacting the hydrocarbon or aqueous fraction with a cellulose acetate bound photosensitizer in the presence of molecular oxygen and light, thereby oxidizing the oxidizable compound with singlet oxygen which is generated from molecular oxygen by energy transfer from the light and the cellulose acetate bound photosensitizer to produce a treated hydrocarbon or aqueous fraction.

2. The method of claim 1 where the sensitizer is selected from the group consisting of rose bengal, rhodamine, acridine orange, fluorescein, methylene blue, metal phthalocyanine, eosin, pyrene, dinaphthalene thiophene, heterocoerdianthrone and zinc tetraphenyl porphyrin.

3. The method of claim 1 where the molecular oxygen is obtained from air.

4. The method of claim 1 further characterized in that the treating of the hydrocarbon or aqueous fraction is carried out in a batch process.

5. The method of claim 4 where the hydrocarbon or aqueous fraction, molecular oxygen, photosensitizer and light are contacted for a time of about 30 to about 450 min.

6. The method of claim 1 further characterized in that the treating of the hydrocarbon or aqueous fraction is carried out in a continuous flow process.

7. The method of claim 1 where the light has a wavelength from about 350 to about 800 nm.

8. The method of claim 1 where the oxidizable compound is a mercaptan and is present in a hydrocarbon fraction.

9. The method of claim 1 where the oxidizable compound is a phenol and is present in an aqueous or organic fraction.

* * * * *